United States Patent [19]
Nakamura

[11] Patent Number: 5,225,699
[45] Date of Patent: Jul. 6, 1993

[54] DRAM HAVING A LARGE DIELECTRIC BREAKDOWN VOLTAGE BETWEEN AN ADJACENT CONDUCTIVE LAYER AND A CAPACITOR ELECTRODE AND METHOD OF MANUFACTURE THEREOF

[75] Inventor: Hiroshi Nakamura, Hyogo, Japan

[73] Assignee: Mitsubishi Denki Kabushiki Kaisha, Tokyo, Japan

[21] Appl. No.: 831,438

[22] Filed: Feb. 5, 1992

[30] Foreign Application Priority Data

Feb. 8, 1991 [JP] Japan .................. 3-018043

[51] Int. Cl.⁵ .............. H01L 29/68; H01L 29/78; H01L 29/92
[52] U.S. Cl. .................. 257/306; 257/385; 257/900
[58] Field of Search ........... 357/23.6; 257/306, 385, 257/900

[56] References Cited

U.S. PATENT DOCUMENTS 5,012,310 4/1991 Kimura et al. ............ 357/23.6
5,068,707 11/1991 Pors et al. ............... 357/23.6

Primary Examiner—Rolf Hille
Assistant Examiner—Robert Limanek
Attorney, Agent, or Firm—Lowe, Price, LeBlanc & Becker

[57] ABSTRACT

An upper electrode of a capacitor is structured to have its end surface recessed from an end surface of an interlayer insulating layer covering a surface of said electrode layer, at a position where the upper electrode faces a bit line contact portion. The upper electrode layer and the first interlayer insulating layer are patterned to have the same end surface shape. Subsequently, only a side surface of the upper electrode layer is etched and recedes by isotropic etching. The receding surface of the upper electrode layer and a side surface of said interlayer insulating layer are covered with a sidewall insulating layer. The bit line contact portion or a pad layer for a bit line contact is formed along a surface of the sidewall insulating layer. The sidewall insulating layer is formed thick by a receding amount of the upper electrode of the capacitor from the first interlayer insulating layer. Thus, distance between the upper electrode of the capacitor and the bit line contact portion is increased, and therefore a dielectric breakdown voltage therebetween is also increased.

9 Claims, 13 Drawing Sheets

DRAM HAVING A LARGE DIELECTRIC BREAKDOWN VOLTAGE BETWEEN AN ADJACENT CONDUCTIVE LAYER AND A CAPACITOR ELECTRODE AND METHOD OF MANUFACTURE THEREOF

BACKGROUND OF THE INVENTION

1. Field of the Invention

The present invention relates to a structure in which insulating property between a conductive layer and an interconnection contact portion can be improved and a method of manufacture thereof, in a semiconductor device having a conductive layer adjacent to the interconnection contact portion.

2. Description of the Background Art

A configuration of a DRAM (Dynamic Random Access Memory) allowing random input/output of information to be stored will be described as an example of a conventional semiconductor device. FIG. 15 is a block diagram showing a configuration of a general DRAM. Referring to FIG. 15, a DRAM 50 includes a memory cell array 51 for storing a data signal, a row and column address buffer 52 externally receiving address signals ($A_0$–$A_9$) for selecting a memory cell, a row decoder 53 and a column decoder 54 for designating a memory cell by decoding the address signals, a sense refresh amplifier 55 amplifying and reading a signal stored in the designated memory cell, a data in buffer 56 and a data out buffer 57 for data input/output, and a clock generator 58 generating a clock signal. Clock generator 58 is connected to receive a row address strobe signal $\overline{RAS}$ and a column address strobe signal $\overline{CAS}$.

In operation, a data signal stored in a memory cell designated by address signals is read by a sense refresh amplifier 24, and is applied to data out buffer 57 through a preamplifier. Data out buffer 57 outputs the data signal in response to a clock signal from a clock generator 58.

FIG. 16 is an equivalent circuit diagram of one memory cell configuring a memory cell array. A memory cell 3 is constituted by one MOS transistor 5 and one capacitor 6. Either of the source region and the drain region of MOS transistor 5 is connected to a bit line 20, and a gate electrode is connected to a word line 8a.

FIG. 17 is a plan structural view of a memory cell, and FIG. 18 is a sectional structural view taken along a line A—A in FIG. 17. Referring to both views, one MOS transistor 5 and one stacked capacitor 6 are formed on a main surface of a silicon substrate 1.

MOS transistor 5 has a pair of source/drain regions 9, 9 and a gate electrode 8a formed on a surface of silicon substrate 1 with a thin gate insulating film 7 interposed. Gate electrode 8a forms a part of a word line.

Stacked capacitor 6 has a multiple layer structure in which a lower electrode 12, a dielectric layer 13 and an upper electrode 14 are provided. One portion of lower electrode 12 is connected to a surface of source/drain regions 9. One of the end portions of capacitor 6 extends above gate electrode 8a with an insulating layer 10 interposed. An upper electrode (a cell plate) 14 of capacitor 6 is formed to cover a whole surface of a memory cell array region. An opening is formed in the vicinity of a bit line contact portion of bit line 20 and source/drain region 9. Referring to FIG. 18, the end portion of upper electrode 14 located above gate electrode 8a defines an end surface of the opening. A first interlayer insulating layer 16 is formed on a surface of upper electrode 14 of capacitor 6. An end surface of first interlayer insulating layer 16 above gate electrode 8a is formed aligned with the end surface of upper electrode 14. Furthermore, a sidewall insulating layer 15 is formed on the end surface of upper electrode 14 of the capacitor and the end surface of first interlayer insulating layer 16.

A conductive pad layer 18 is formed on a surface of source/drain region 9 contacting the bit line. Pad layer 18 extends from the center of source/drain region 9 to surfaces of insulating layer 10, sidewall insulating layer 15 and first interlayer insulating layer 16. A second interlayer insulating layer 17 is formed thick on surfaces of first interlayer insulating layer 16 and pad layer 18. A contact hole 19 is formed in a region located above pad layer 18 of a second interlayer. Bit line 20 is arranged on a surface of interlayer insulating layer 17, and connected to pad layer 18 and source/drain region 9 through contact hole 19.

Manufacturing steps of the memory cell shown in FIG. 18 will be described. FIGS. 19 through 24 are sectional views of the memory cell in the manufacturing steps.

Referring to FIG. 19, a field oxide film 2 is formed in an isolation region of silicon substrate 1 using a LOCOS method. A gate insulating layer film 7 is formed using a thermal oxidation method, and a polycrystal silicon layer is further formed on a surface thereof. A gate electrode 8a is subsequently formed by patterning the polycrystal silicon layer. The surface of silicon substrate 1 is subjected to ion implantation of impurities of a conductivity type different from that of the substrate, using gate electrode 8a as a mask to form source/drain regions 9, 9. Consequently, the periphery of gate electrode 8a is coated with insulating layer 10.

Referring to FIG. 20, after the whole surface is coated with oxide film 30, a prescribed region is etched away. The oxide film 30 is provided to protect regions other than capacitor in forming a capacitor.

Referring to FIG. 21, after a polycrystal silicon layer is deposited on a whole surface, it is patterned to form a lower electrode 12 of the capacitor. A dielectric layer 13 is formed on a surface of lower electrode 12.

Referring to FIG. 22, an upper electrode layer 14 is deposited to cover a whole surface of dielectric layer 13. A first interlayer insulating layer 16 is deposited on a surface of upper electrode layer 14. First interlayer insulating layer 16 and upper electrode layer 14 are patterned. An opening located above one of source/drain regions 9 is formed in first interlayer insulating layer 16 and upper electrode layer 14 by the patterning. The end surfaces of first interlayer insulating layer 16 and upper electrode layer 14, which are facing the opening, are formed to be aligned with each other.

Referring to FIG. 23, an insulating film is deposited on a whole surface, and the insulating film is selectively etched away using anisotropic etching. A second sidewall insulating layer 15 is formed on the aligned end surfaces of first interlayer insulating layer 16 and upper electrode layer 14 in the etching step. The surface of upper electrode 14 is coated with first interlayer insulating layer 16 and second sidewall insulating layer 15.

Referring to FIG. 24, pad layer 18 is formed connected to source/drain region 9. Pad layer 18 extends from the center of source/drain region 9 to the periphery thereof, for example, above second interlayer insulating layer 15 and first interlayer insulating layer 16.

Second interlayer insulating layer 17 is then formed, and contact hole 19 reaching pad layer 18 is formed therein. A bit line 20 is formed on a surface of second interlayer insulating layer 17 and within contact hole 19. A memory cell shown in FIG. 18 is completed by performing the above described steps.

There is a problem of poor insulating property between upper electrode 14 of capacitor 6 and pad layer 18 connected to bit line 20 in a conventional memory cell configuration shown in FIG. 18. Upper electrode 14 of capacitor 6 and pad layer 18 are insulated and isolated mainly by second interlayer insulating layer 15. Referring again to FIG. 23, the second sidewall insulating layer 15 is formed only on sidewalls of upper electrode 14 and first interlayer insulating layer 16 by subjecting the insulating layer deposited on the whole surface of the substrate to anisotropic etching. In the anisotropic etching step, etching is performed more excessively than necessary to etch away the deposited insulating layer in order to expose the surface of source/drain region 9 completely. Because of this overetching, the second sidewall insulating film is liable to be thinner than it was at (the time of) deposition. Thus, the distance between upper electrode 14 and pad layer 18 is reduced and therefore a problem arises that a dielectric breakdown voltage therebetween is decreased.

SUMMARY OF THE INVENTION

One object of the present invention is to increase a dielectric breakdown voltage between a conductive layer adjacent to a capacitor and a capacitor electrode in a DRAM.

Another object of the present invention is to provide improved insulation between a bit line contact portion and a stacked capacitor.

Yet another object of the present invention is to provide a method of manufacturing a DRAM in which dielectric breakdown voltage between a capacitor electrode and the conductive layer adjacent to the capacitor electrode can be increased.

In one aspect of the present invention, a DRAM has a semiconductor substrate of a first conductivity type having a main surface. First and second impurity regions of a second conductivity type are formed on the main surface of the semiconductor substrate. Furthermore, on the main surface of the semiconductor substrate between first and second impurity regions, a gate electrode layer is formed with a gate insulating layer interposed. A surface of the gate electrode layer is coated with a first insulating layer. On the surface of the first impurity layer, a lower electrode layer having one end extending to a surface of a first electrode layer of the gate electrode layer is formed; on the surface of the lower electrode layer, a dielectric layer is formed; and on the surface of the dielectric layer, an upper electrode layer terminating above the gate electrode is formed. A first interlayer insulating layer is formed on a surface of the upper electrode layer. The first interlayer insulating layer terminates above the gate electrode, and the terminating position is formed nearer to a second impurity region with respect to the terminating position of the upper electrode layer. A sidewall insulating layer covering end side surfaces of the upper electrode layer and the first interlayer insulating layer is formed above the gate electrode layer. A second interlayer insulating layer is formed on a surface of the first interlayer insulating layer, and an interconnection layer is connected to the second impurity region through a contact hole formed in the first interlayer insulating layer.

In a second aspect of the present invention, a DRAM is further characterized in that an end side surface of an upper electrode layer above a gate electrode is formed inclined with respect to the main surface of the semiconductor substrate.

In a third aspect of the present invention, a method of manufacturing a DRAM including a semiconductor substrate having an impurity region, an interconnection contact portion connected to the impurity region, a conductive layer having an end portion adjacent to the interconnection contact portion, an upper insulating layer covering an upper surface and a side surface of the conductive layer, and a sidewall insulating layer, includes the following steps.

First, while an impurity region is formed in a main surface of a semiconductor substrate, a first insulating layer is formed on the main surface. Next, a conductive layer and a second insulating layer are stacked successively on a surface of the first insulating layer. The second insulating layer and the conductive layer are patterned to a prescribed shape, so that end surfaces of the second insulating layer and the conductive layer are formed to be aligned. Then, with the second insulating layer being formed, the conductive layer is partially etched to have the end surface of the conductive layer recessed from a side surface of the second insulating layer. A sidewall insulating layer is formed on the end surface of the second insulating layer and the recessed surface of the conductive layer. Finally, an interconnection contact portion connected to the impurity region is formed adjacent to the sidewall insulating layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
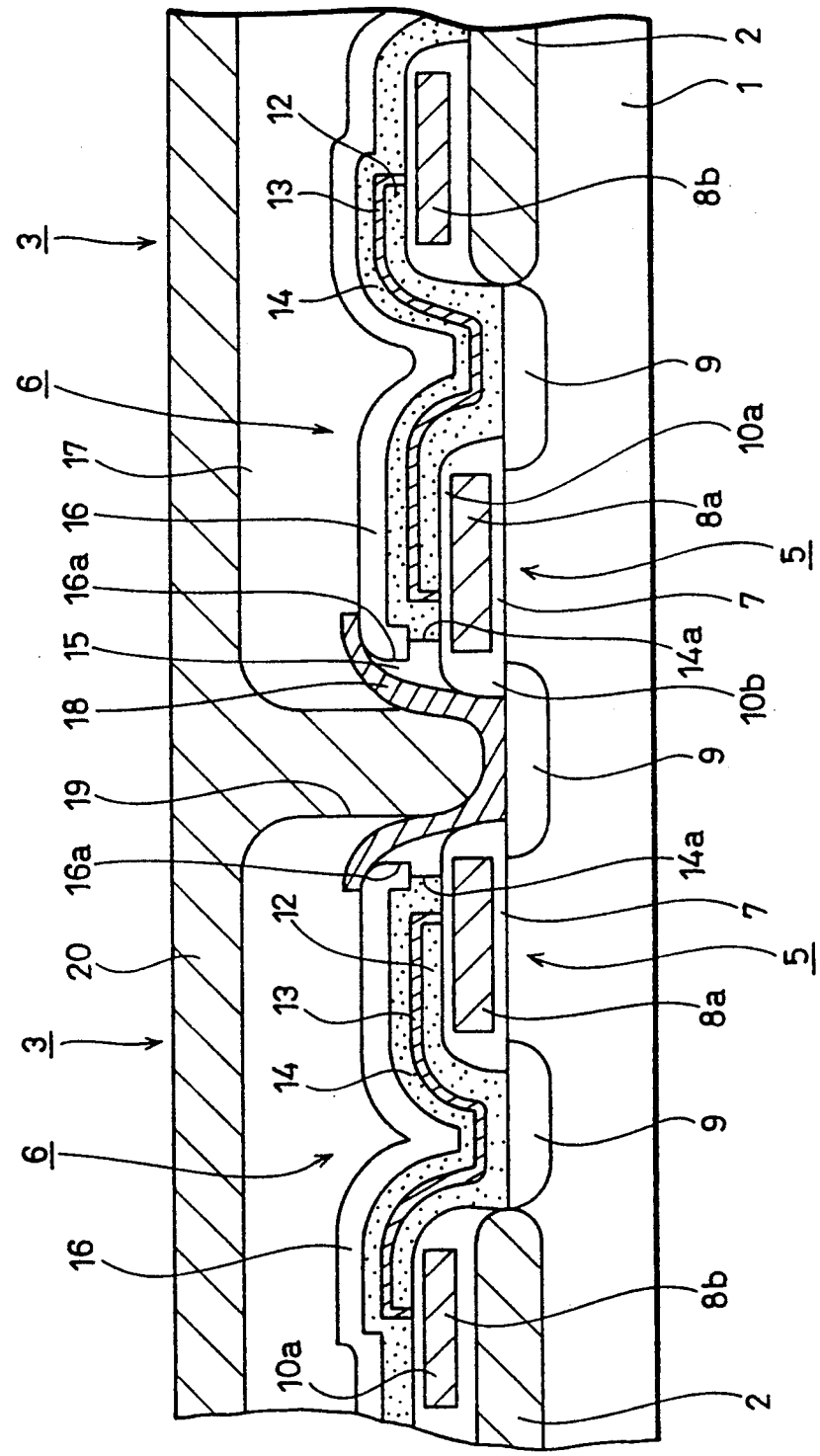
FIG. 1 is a sectional structural view of a memory cell of a DRAM according to a first embodiment of the present invention.

Referring to FIG. 1, memory cells for 2 bits sharing one bit line contact portion are shown. A memory cell 3 is formed of one transfer gate transistor 5 and one stacked capacitor 6.

Transfer gate transistor 5 has one pair of source/drain regions 9, 9 and a gate electrode 8a formed on a surface of a silicon substrate with a gate insulating layer 7 interposed. Gate electrode 8a forms one portion of a word line. A word line 8b is shown above a field oxide film 2. Upper surfaces of gate electrode 8a and word line 8b are covered with an upper insulating layer 10a, and their side surfaces are covered with a first sidewall insulating layer 10b.

Stacked capacitor 6 has a multilayer structure comprising a lower electrode 12, a dielectric layer 13 and an upper electrode 14. Lower electrode 12 is connected to one of source/drain regions 9, 9, and one end thereof extends above gate electrode 8a with an upper insulating layer 10a interposed. The other end extends above word line 8b with upper insulating layer 10a interposed. Dielectric layer 13 is formed to cover a surface of lower electrode 12. Dielectric layer 13 is formed of an oxide film, a nitride film, or a composite film thereof, a tantalum oxide film or the like.

An upper electrode 14 completely covers a surface of dielectric layer 13, and extends to a whole surface of the memory cell array region. A bit line 20 is formed to have an opening only on the periphery of a bit line contact portion through which it is connected to source/drain region 9. That is, a region enclosed by an end portion 14a formed above gate electrode 8a forms the opening. A first interlayer insulating layer 16 is formed on a surface of upper electrode 14. An end surface 16a of first interlayer insulating layer 16 facing the bit line contact portion is formed to have a protruding portion with respect to end surface 14a of upper electrode 14 of the capacitor. In other words, end surface 14a of upper electrode 14 of capacitor 6 is formed to recede from end surface 16a of the first interlayer insulating layer. End surface 16a of the first interlayer insulating layer and end surface 14a of upper electrode 14 is covered with a second sidewall insulating layer 15.

In the other source/drain region 9 of transfer gate transistor 5, a conductive pad layer 18 formed of polysilicon is formed. Pad layer 18 extends from the center of source/drain region 9 onto second sidewall insulating layer 15 and first interlayer insulating layer 16. Pad layer 18 is provided to secure a margin for positioning of bit line 20 and source/drain region 9. That is, bit line 20 does not need to directly contact the exposed surface of source/drain region 9, but it only needs to contact an enlarged surface region of pad layer 18 formed to be self-aligned with source/drain region 9. Thus, it is not necessary to consider a mask alignment error of bit line 20 for contact hole 19 and source/drain region 9.

Bit line 20 is arranged on a surface of a second interlayer insulating layer 17 formed on a relatively flat surface.

A method of manufacturing a memory cell of the present embodiment will be described with reference to figures.

Figure 2:
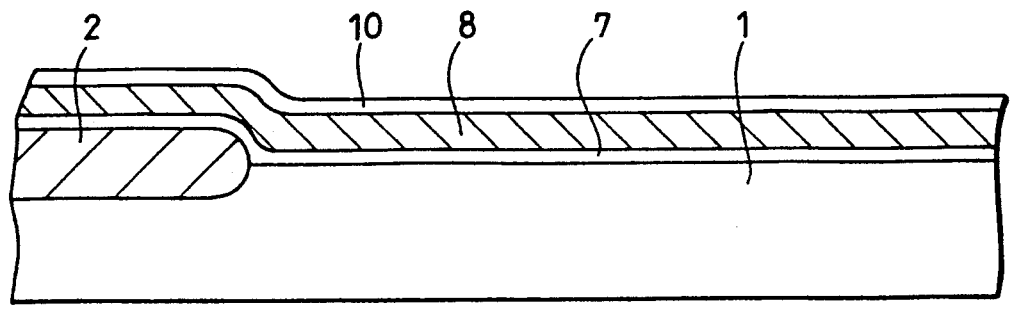
FIGS. 2 through 11 are sectional structural views showing the steps of manufacturing the memory cell of the DRAM shown in FIG. 1.

Referring to FIG. 2, a thick field oxide film 2 is formed using, for example, a LOCOS method in a prescribed region of a main surface of a silicon substrate 1. A surface of silicon substrate 1 is subjected to thermal oxidation to form a gate insulating film 7 on a main surface of a region surrounded by field oxide film 2. A conductive layer 8 is then formed of, for example, a phosphorus-doped polycrystalline silicon layer, on a surface of gate insulating film 7 using, for example, a low pressure CVD method. An insulating layer 10 such as an oxide film is deposited using the low pressure CVD method on a surface of conductive layer 8.

Figure 3:
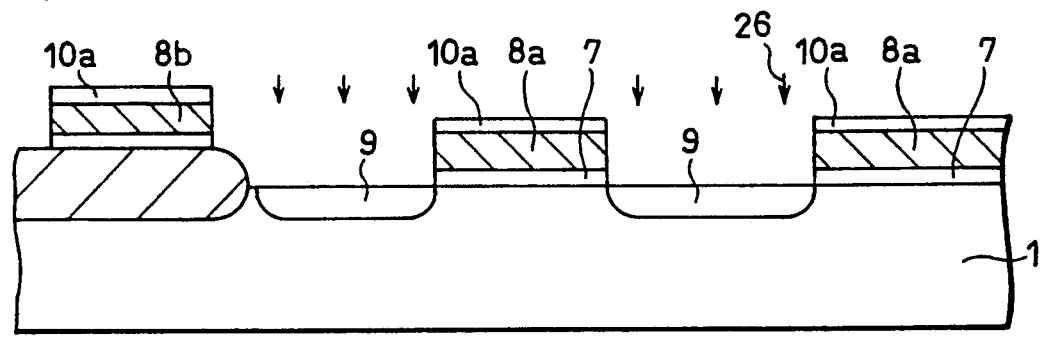

Referring to FIG. 3, using a photolithography method and a dry etching method, an insulating layer 10, a polycrystal silicon layer 8, and a gate insulating layer 7 are patterned to a prescribed shape, whereby a word line 8b and a gate electrode 8a of a transfer gate transistor are formed. Impurity ions 26 such as phosphorus or arsenic are implanted in the surface of silicon substrate 1 using patterned gate electrode 8a and upper insulating layer 10a as a mask. Thus, source/drain regions 9, 9 are formed.

Figure 4:
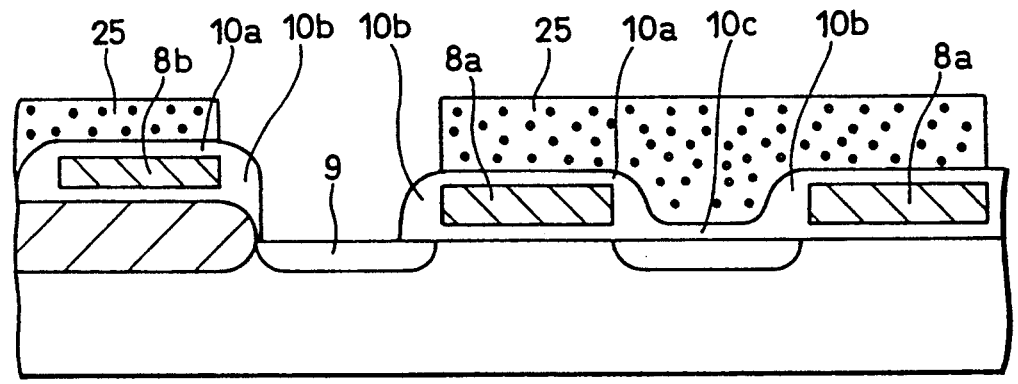

Referring to FIG. 4, an insulating layer such as an oxide film is deposited on a whole surface using the low pressure CVD method. After resist is applied to a surface of the insulating layer, a resist pattern 25 having an opening above one of source/drain regions 9, 9 is formed. An insulating layer exposed within the opening of resist pattern 25 is selectively etched away by anisotropic etching, so that a surface of source/drain region 9 is exposed, and sidewall insulating layers 10b, 10b are formed on sidewalls of gate electrode 8a and word line 8b.

Figure 5:
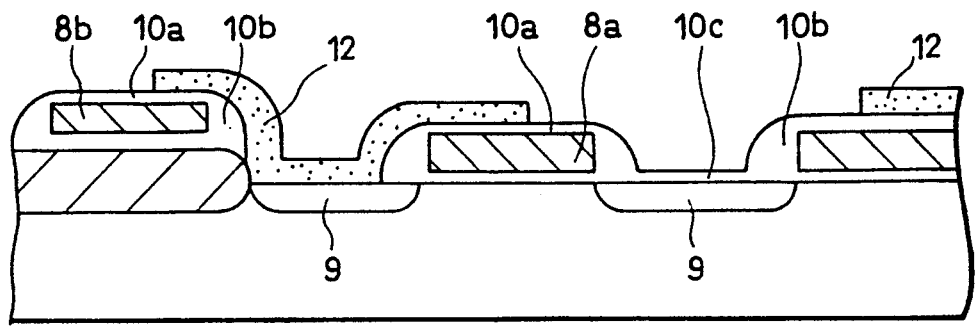

Referring to FIG. 5, a conductive layer such as a polycrystalline silicon layer is deposited on surfaces of exposed source/drain region 9 and insulating layers 10a, 10b, 10c using, for example, the low pressure CVD method. The conductive layer is patterned using the photolithography method and the etching method to form a lower electrode 12 of capacitor 6. Through out the steps, an insulating layer 10c remains on a surface of one of source/drain region 9 which contacts a bit line. The surface of silicon substrate 1 is therefore prevented from being damaged in etching for patterning of lower electrode 12.

Figure 6:
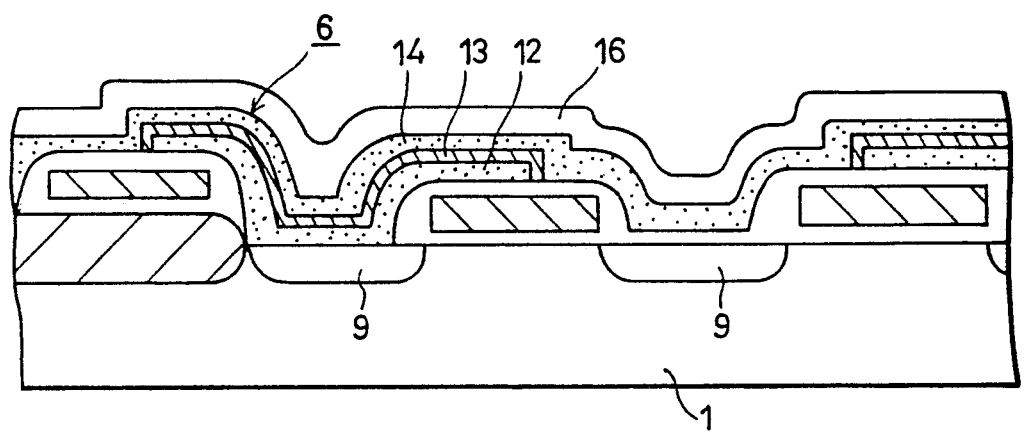

Referring to FIG. 6, by depositing a nitride film on a whole surface by, for example the low pressure CVD method and then heat-treating silicon substrate 1 in oxygen atmosphere, one portion of the nitride film is oxidized to form a dielectric layer 13 comprising the nitride film and an oxide film formed on the surface thereof. Thereafter, dielectric layer 13 is patterned. A polycrystalline silicon layer 14 having conductivity is deposited on a whole surface using the lower pressure CVD method. An insulating film 16 such as an oxide film is formed thereon using the low pressure CVD method.

Figure 7:
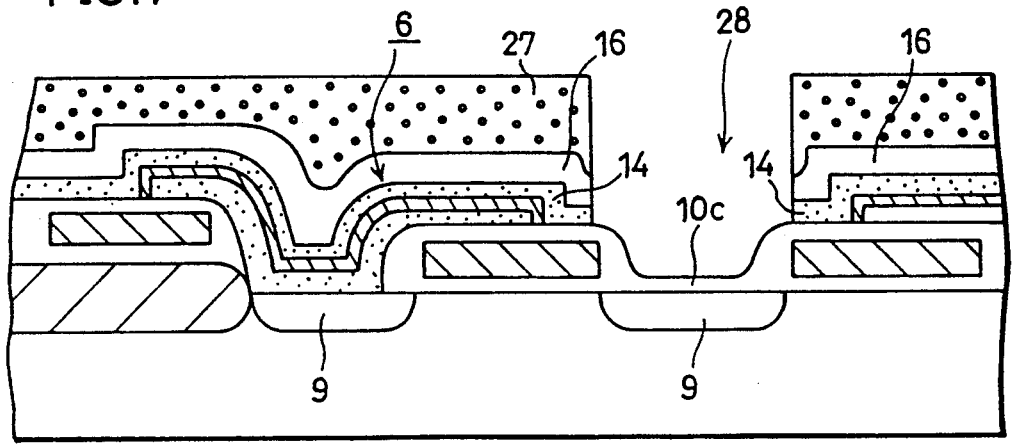

Referring to FIG. 7, resist 27 is applied to a surface of insulating film 16. An opening 28 is formed for a bit line opening using the photolithography method and the etching method. Using resist pattern 27 having the formed opening 28 as a mask, a first interlayer insulating layer 16 and an upper electrode layer 14 of the capacitor are etched away, whereby aligned end surfaces facing opening 28 are formed. Also in this etching step, insulating layer 10c remains on the surface of source/drain region 9. Therefore, the surface of silicon substrate 1 is prevented from being damaged by etching.

Figure 8:
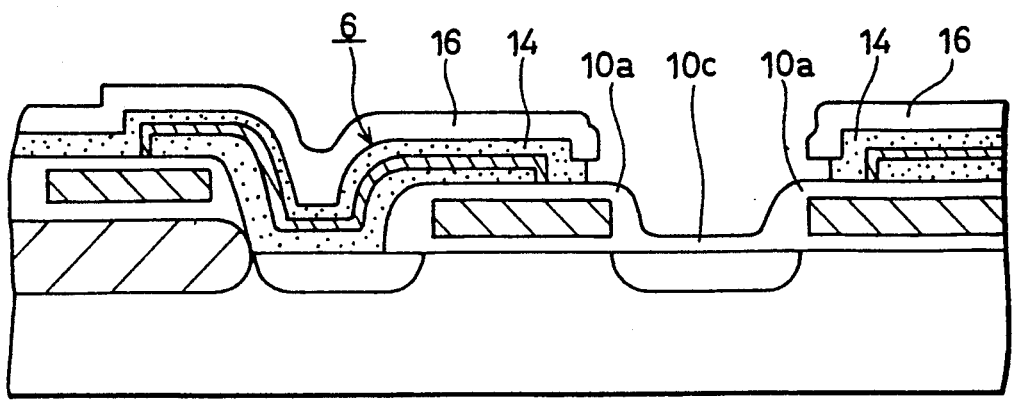

Referring to FIG. 8, after resist 27 is removed, an end surface of upper electrode layer 14 of the capacitor is selectively etched away using an etching method having isotropy. For this etching, an etching method having etching selectivity between first interlayer insulating layer 16 and upper electrode layer 14 of a capacitor is employed. The end surface of upper electrode layer 14 is recessed with respect to the position of the end surface of first interlayer insulating layer 16 by the etching. An recessed amount by the etching is, for example, about 2000 Å.

Figure 9:
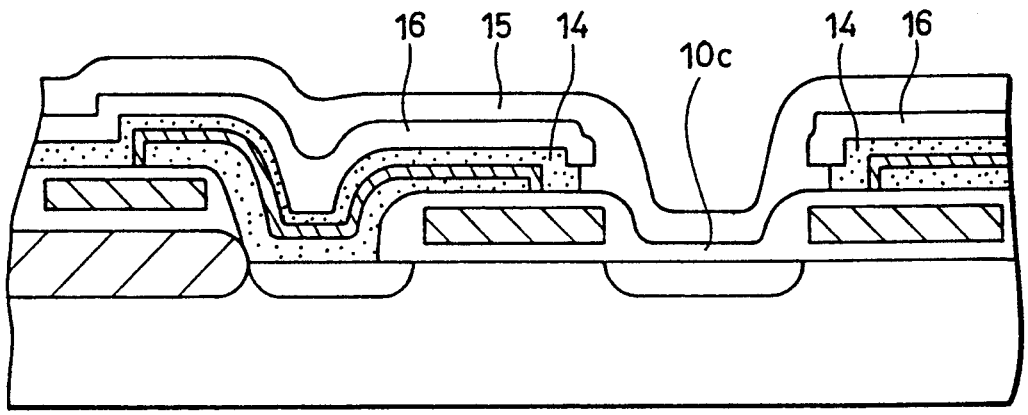

Referring to FIG. 9, an insulating layer 15 is deposited on a whole surface using, for example, the low pressure CVD method.

Figure 10:
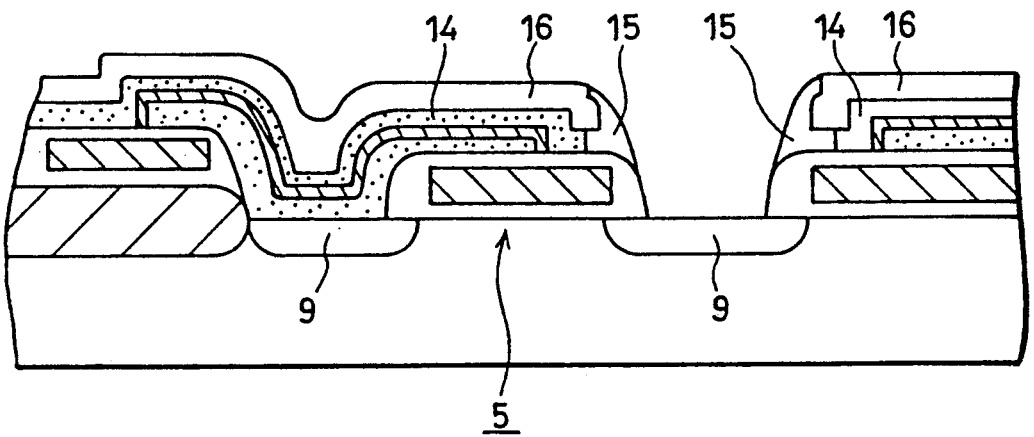

Referring to FIG. 10, insulating layer 15 is etched away using anisotropic etching, so that a second sidewall insulating layer 15 remains on the side surfaces of first interlayer insulating layer 16 and upper electrode layer 14. An insulating layer 10c remaining on the surface of source/drain region 9 is then etched away.

Figure 11:
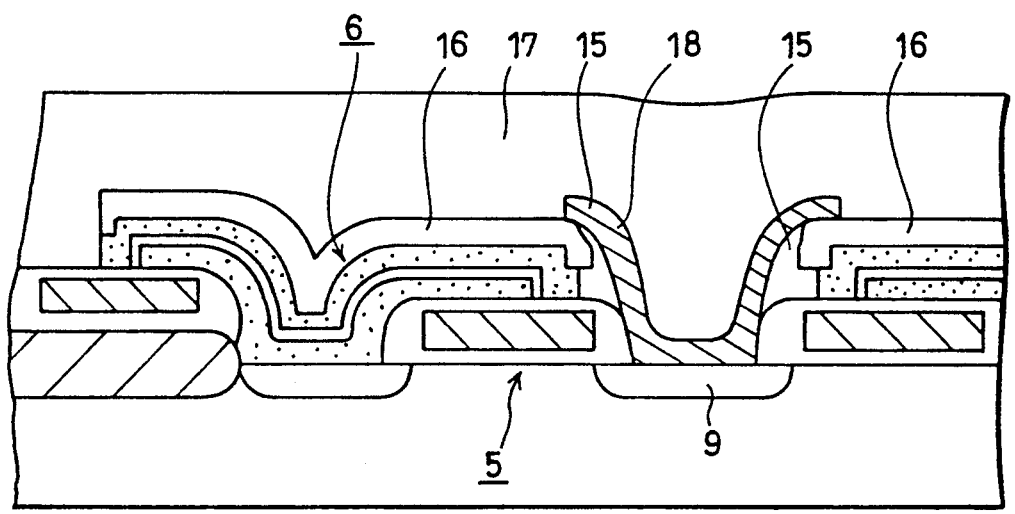

Referring to FIG. 11, after, for example, a polycrystalline silicon layer having conductivity is deposited on a whole surface, it is patterned to a prescribed shape to form a pad layer 18. Pad layer 18 is formed to connect with source/drain region 9 in a self-aligned manner and to extend on surfaces of second sidewall insulating layer 15 and first interlayer insulating layer 16. At this time, pad layer 18 has second sidewall insulating layer 15 or first interlayer insulating layer 16 interposed between the pad layer itself and upper electrode layer 14 of capacitor 6. Thus, sufficient distance therebetween is secured. A second interlayer insulating layer 17 is formed thick on a whole surface. A contact hole 19 is formed in second interlayer insulating layer 17, and bit line 20 is formed on a surface of interlayer insulating layer 17 and within contact hole 19. By following the above described steps, the memory cell shown in FIG. 1 is completed.

Figure 12:
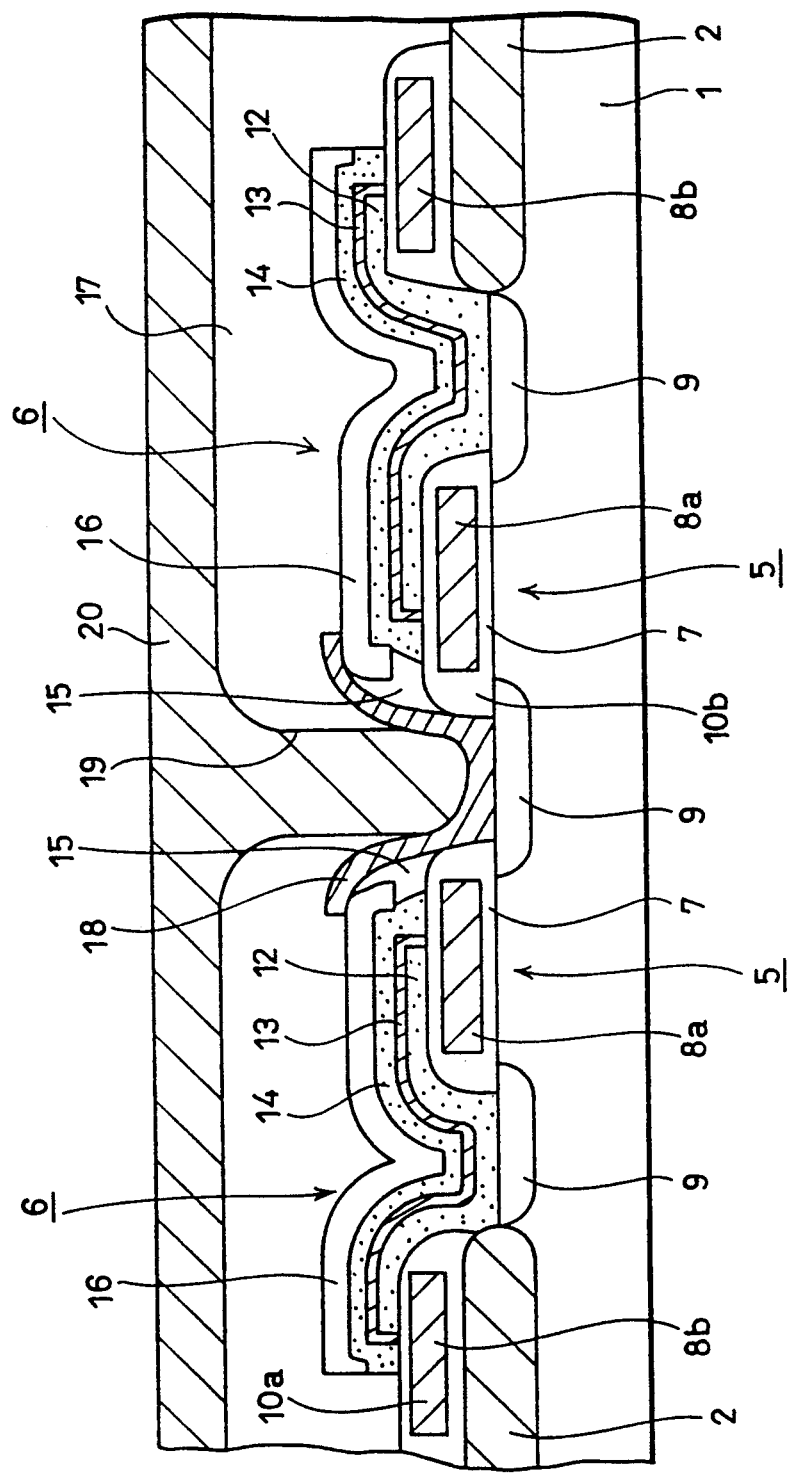
FIG. 12 is a sectional structural view of a memory cell of a DRAM according to a second embodiment of the present invention.

A second embodiment of the present invention will be described. Referring to FIG. 12, the embodiment is characterized in that a recessed side surface of upper electrode layer 14 of a capacitor is formed to be inclined with respect to a main surface of a silicon substrate. The end surface of upper electrode 14 is formed such that a portion nearer to the main surface of silicon substrate 1 is nearer to the bit line and a portion farther from the substrate surface is farther from the bit line, as shown in the figure, whereby shortest distance between pad layer 18 and upper electrode layer 14 can be made greater.

Figure 13:
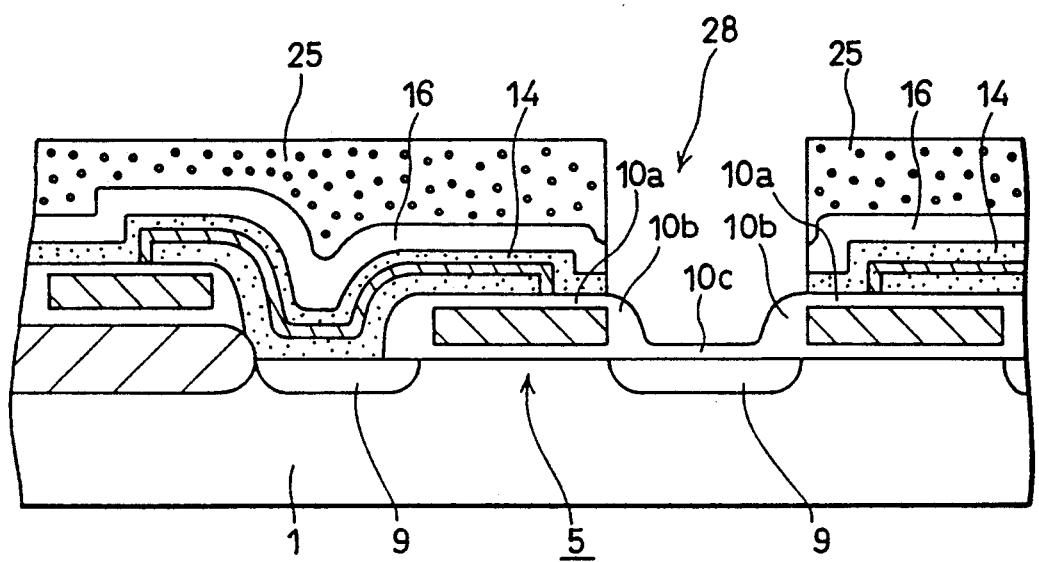
FIGS. 13 and 14 are sectional structural views showing major steps of manufacturing the memory cell of the DRAM shown in FIG. 12.
Figure 14:
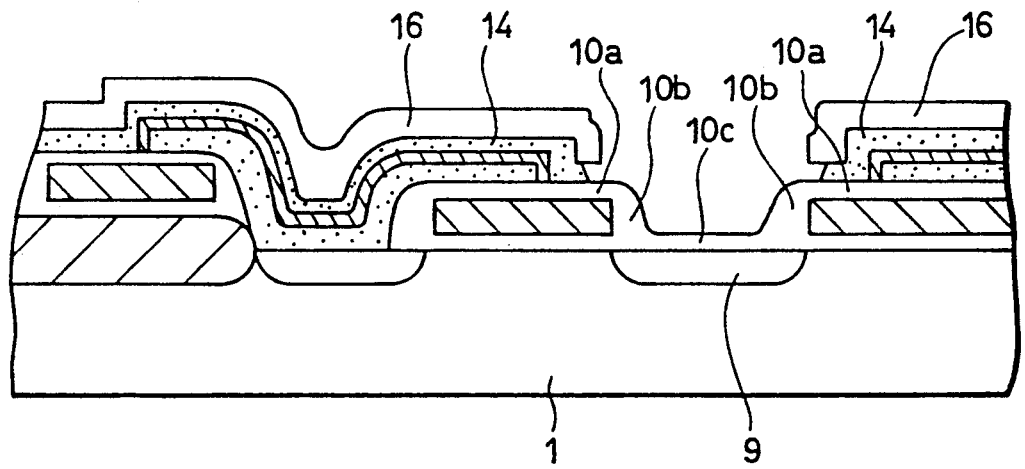
Figure 15:
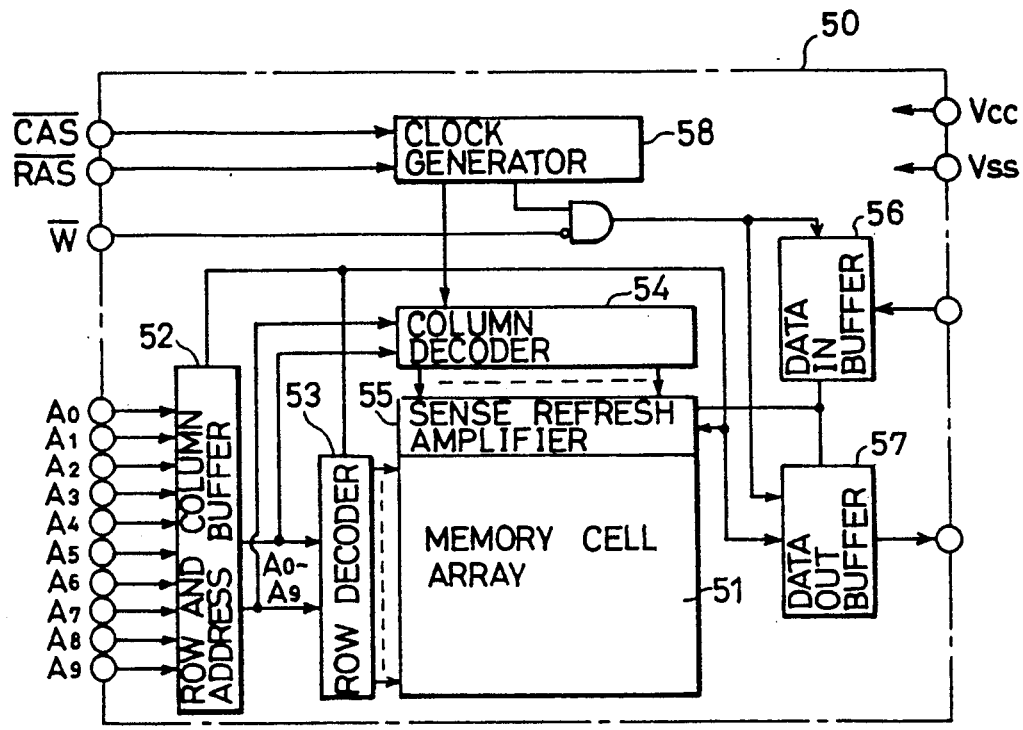
FIG. 15 is a block diagram showing a configuration of a general DRAM.
Figure 16:
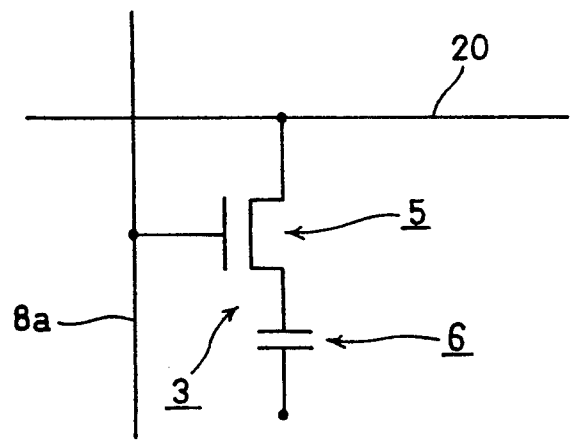
FIG. 16 is an equivalent circuit diagram of a memory cell.
Figure 17:
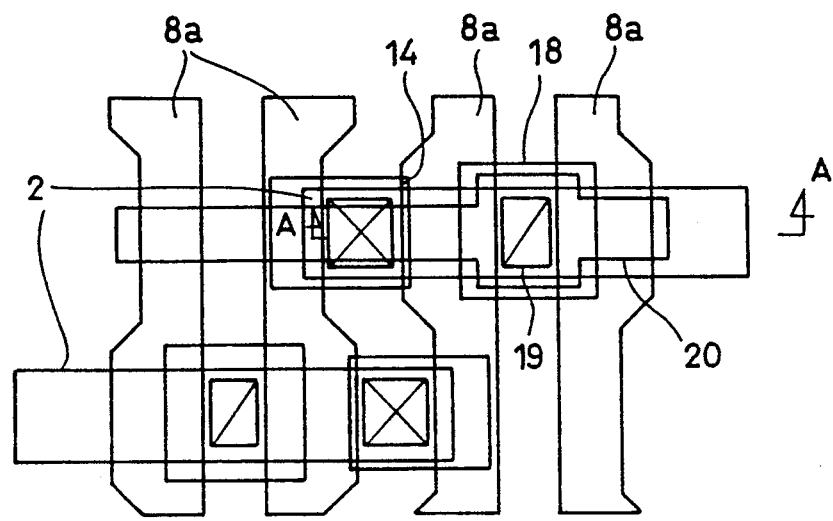
FIG. 17 is a plan structural view of a memory cell of a conventional DRAM.
Figure 18:
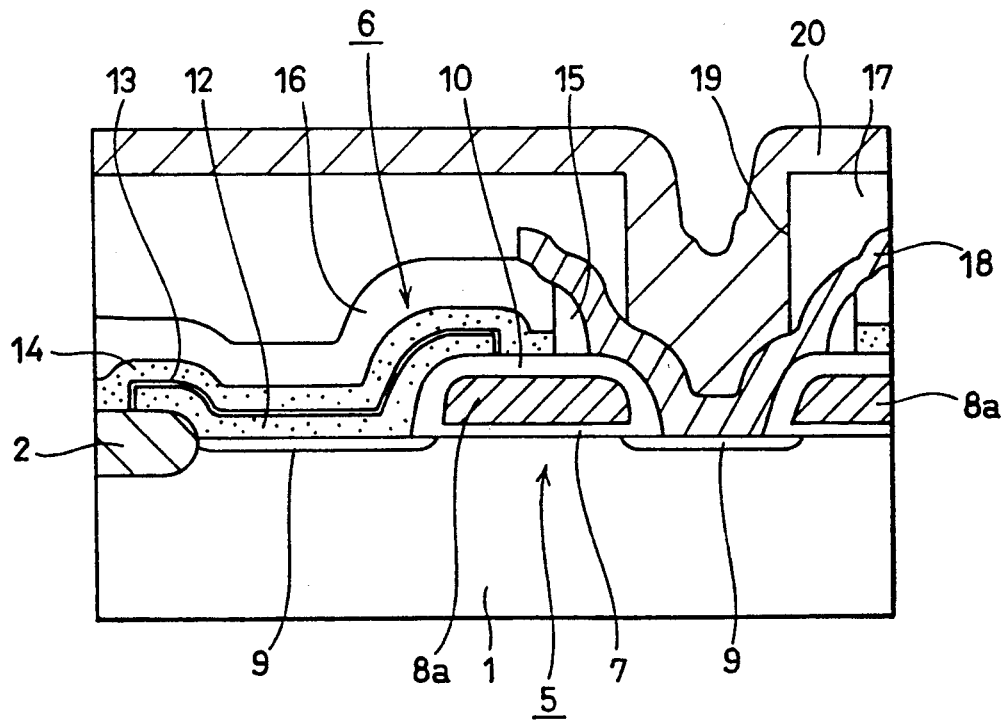
FIG. 18 is a sectional structural view taken along line A—A in FIG. 17.
Figure 19:
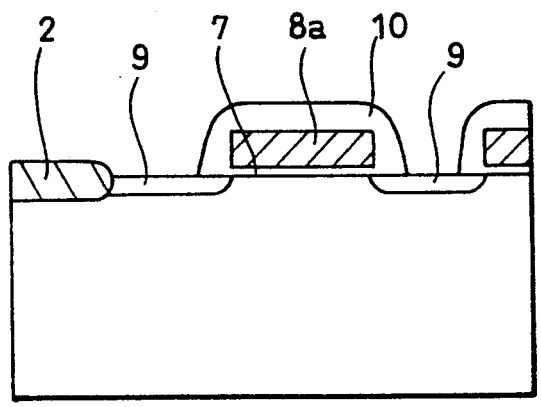
FIGS. 19 through 24 are sectional structural views showing steps of manufacturing the memory cell shown in FIG. 18.
Figure 20:
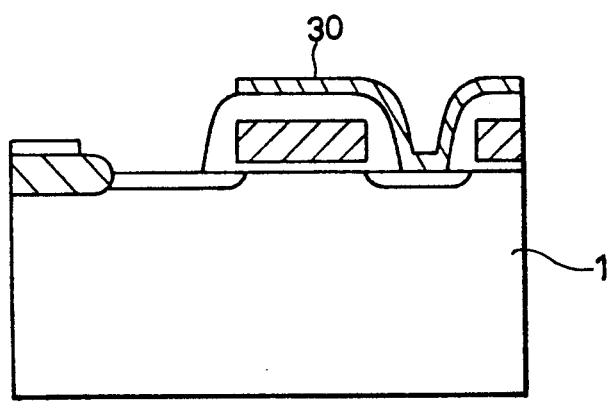
Figure 21:
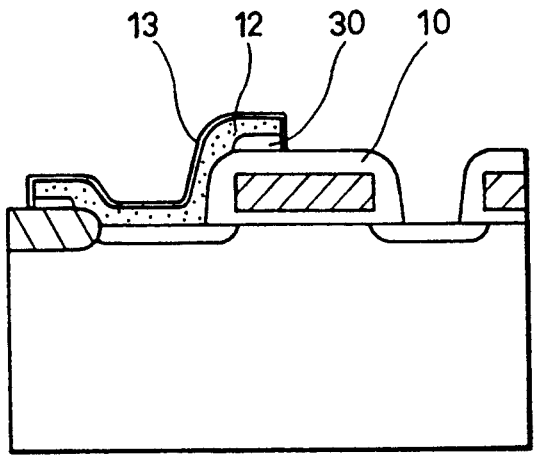
Figure 22:
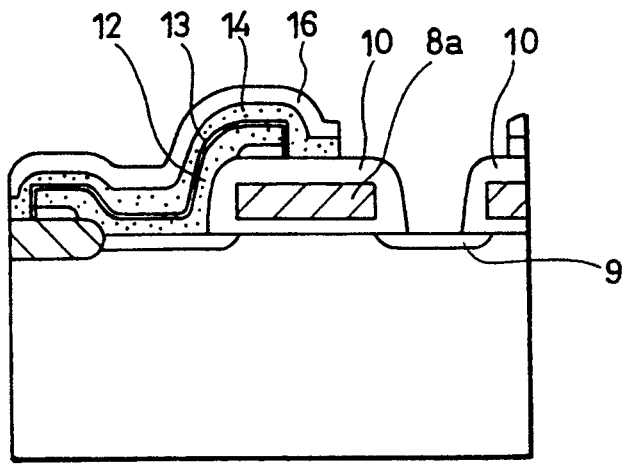
Figure 23:
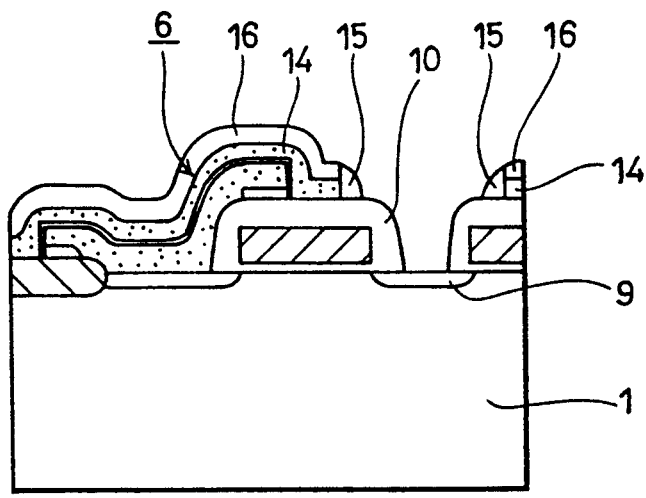
Figure 24:
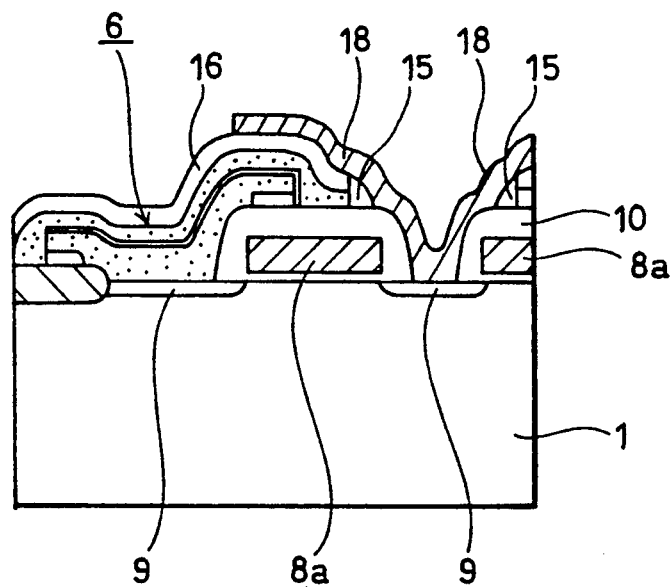

Manufacturing steps characteristic to the memory cell shown in FIG. 12 will be described. FIG. 13 shows the same step as the one shown in FIG. 7 in the first embodiment. FIG. 14 shows the same step as the one shown in FIG. 8. That is, referring to FIG. 13, a first interlayer insulating layer 16 and an upper electrode layer 14 are etched using resist pattern 25 having opening 28 as a mask. At this time, an etching amount of upper electrode layer 14 is slightly reduced by controlling an etching time period, so that a side surface of upper electrode 14 facing opening 28 has a small unetched portion left in the vicinity of a surface of upper insulating layer 10a.

Referring to FIG. 14, upper electrode layer 14 is selectively etched away using, for example, plasma etching having isotropy. An exposed end surface of upper electrode layer 14 etched by this etching, recedes from a position of the end surface of second interlayer insulating layer 16. At this time, the recessed surface of upper electrode layer 14 is etched away to have the same shape as that of the end surface before it was etched. Therefore, the end surface of upper electrode layer 14 is formed, as shown in the figure, such that a portion closer to the surface of upper insulating layer 10a is more recessed than a portion closer to first interlayer insulating layer 16, since the former portion is more etched than the latter portion. Thus, the end surface of upper electrode layer 14 of the capacitor is formed to have an inclined shape with respect to the main surface of silicon substrate 1.

In the above first and second embodiments, a general stacked capacitor was described; however, a structure of capacitor is not limited thereto. A capacitor may have a portion cylindrically protruded with respect to a main surface of a substrate.

In the above first and second embodiments, a structure in which a bit line contact portion is connected through pad layer 18 was described; however, the pad layer 18 is not particularly necessary. The present invention can be applied to a structure even without pad layer 18, if there is a problem of insulating property between a contact portion of a bit line and an upper electrode of a capacitor.

Thus, in a semiconductor device according to the present invention, an insulating film is formed thick between an upper electrode of a capacitor and an adjacent conductive layer, by having the upper electrode layer of the capacitor recessed with respect to an end surface of a first interlayer insulating layer covering an upper surface of the upper electrode layer by isotropic etching, and covering the side surface of the upper electrode layer with a sidewall insulating layer, so that a dielectric breakdown voltage can be increased between the upper electrode of the capacitor and the adjacent conductive layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DRAM, comprising:
   a semiconductor substrate of a first conductivity type having main surface;
   first and second impurity regions of a second conductivity type formed spaced apart on said main surface of the semiconductor substrate;
   a gate electrode layer formed on said main surface of the semiconductor substrate between said first and second impurity regions with a gate insulating layer interposed;
   a first insulating layer covering a surface of said gate electrode layer;
   a lower electrode layer formed on a surface of said first impurity region and having one end portion extending onto a surface of said first insulating layer on said gate electrode layer;
   a dielectric layer formed on a surface of said lower electrode layer;
   an upper electrode layer formed on a surface of said dielectric layer and terminating at a terminal end formed above said gate electrode layer;
   a first interlayer insulating layer formed on a surface of said upper electrode layer and having a terminal end formed above said gate electrode layer,
   the position of the terminal end of said first interlayer insulating layer being formed laterally nearer to said second impurity region with respect to a lateral position of the terminal end of said upper electrode layer;
   a sidewall insulating layer extending under said first interlayer insulating layer to cover an end side surface of said upper electrode layer and extending from under said first interlayer insulating layer to cover an end side surface of said first interlayer insulating layer above said gate electrode layer;

a second interlayer insulating layer formed on a surface of said first interlayer insulating layer; and an interconnection layer connected to said second impurity region through a contact hole formed in said second interlayer insulating layer.

2. The DRAM according to claim 1, wherein the end side surface of said upper electrode layer located above said gate electrode is formed to be inclined with respect to the main surface of said semiconductor substrate.

3. The DRAM according to claim 1, wherein said interconnection layer forms a bit line.

4. The DRAM according to claim 1, wherein said DRAM further comprises a conductive pad layer formed on a surface of said second impurity region; and said interconnection layer is connected to said conductive pad layer through said contact hole reaching a surface of said conductive pad layer.

5. The DRAM according to claim 4, wherein said interconnection layer forms a bit line.

6. The DRAM according to claim 4, wherein the end side surface of said upper electrode layer located above said gate electrode is formed to be inclined with respect to the main surface of said semiconductor substrate.

7. A semiconductor device, comprising:

a semiconductor substrate of a first conductivity type having a main surface;

first and second impurity regions of a second conductivity type formed spaced apart on said main surface of the semiconductor substrate;

a gate electrode layer formed on said main surface of the semiconductor substrate between said first and second impurity regions with a gate insulating layer interposed;

a first insulating layer covering a surface of said gate electrode layer;

a lower electrode layer formed on a surface of said first impurity region and having one end portion extending onto a surface of said first insulating layer on said gate electrode layer;

a dielectric layer formed on a surface of said lower electrode layer;

an upper electrode layer formed on a surface of said dielectric layer and extending laterally beyond said dielectric layer onto said first insulating layer in a direction of said second impurity region to terminate at a terminal end having a terminal face formed above said gate electrode layer, a first interlayer insulating layer formed on a surface of said upper electrode layer and having a terminal end formed above said gate electrode layer, the terminal end of said first interlayer insulating layer being formed laterally nearer to said second impurity region with respect to a lateral position of the terminal end of said upper electrode layer; and a sidewall insulating layer covering end side surfaces of said upper electrode layer and said first interlayer insulating layer above said gate electrode layer.

8. The semiconductor device of claim 7, further comprising:

a second interlayer insulating layer formed on a surface of said first interlayer insulating layer; and an interconnection layer connected to said second impurity region through a contact hole formed in said second interlayer insulating layer.

9. A semiconductor device, comprising:

a semiconductor substrate of a first conductivity type having a main surface;

first and second impurity regions of a second conductivity type formed spaced apart on said main surface of the semiconductor substrate;

a gate electrode layer formed on said main surface of the semiconductor substrate between said first and second impurity regions with a gate insulating layer interposed;

a first insulating layer covering a surface of said gate electrode layer;

a lower electrode layer formed on a surface of said first impurity region and having one end portion extending onto a surface of said first insulating layer on said gate electrode layer;

a dielectric layer formed on a surface of said lower electrode layer;

an upper electrode layer formed on a surface of said dielectric layer and extending laterally beyond said dielectric layer onto said first insulating layer in a direction of said second impurity region to terminate at a terminal end having a terminal face formed above said gate electrode layer, a first interlayer insulating layer formed on a surface of said upper electrode layer and having a terminal end formed above said gate electrode layer, the position of the terminal end of said first interlayer insulating layer being formed laterally nearer to said second impurity region with respect to a lateral position of the terminal end of said upper electrode layer whereby said upper electrode is laterally recessed under said first interlayer insulating layer from said second impurity region; and a sidewall insulating layer extending under said first interlayer insulating layer to cover an end wall of said upper electrode layer and extending out from under said first interlayer insulating layer to cover a side surface of said first interlayer insulating layer whereby interfaces between (i) said sidewall insulating layer and said upper electrode layer and between (ii) said sidewall insulating layer and said first interlayer insulating layer are formed above said gate electrode layer.

* * * * *